US012609267B2

(12) United States Patent
Pfeifer et al.

(10) Patent No.: US 12,609,267 B2
(45) Date of Patent: Apr. 21, 2026

(54) SAMPLE HOLDER, LOADING DEVICE, AND METHOD FOR INSERTING A SAMPLE INTO A SAMPLE HOLDER

(71) Applicants: Leica Mikrosysteme GMBH, Vienna (AT); Leica Microsystems CMS GmbH, Wetzlar (DE)

(72) Inventors: Thomas Pfeifer, Vienna (AT); Heinz Plank, Vienna (AT); Miriam Weller, Wetzlar (DE); Konrad Winkler, Vienna (AT); Rainer Wogritsch, Vienna (AT)

(73) Assignees: LEICA MIKROSYSTEME GMBH, Vienna (AT); LEICA MICROSYSTEMS CMS GMBH, Wetzlar (DE)

( * ) Notice: Subject to any disclaimer, the term of this patent is extended or adjusted under 35 U.S.C. 154(b) by 419 days.

(21) Appl. No.: 18/320,212

(22) Filed: May 19, 2023

(65) Prior Publication Data

US 2023/0386779 A1      Nov. 30, 2023

(30) Foreign Application Priority Data

May 24, 2022      (EP) .................................... 22175165

(51) Int. Cl.
    *H01J 37/20*          (2006.01)
(52) U.S. Cl.
    CPC ....... *H01J 37/20* (2013.01); *H01J 2237/2007* (2013.01); *H01J 2237/204* (2013.01)

(58) Field of Classification Search
    CPC .... G01N 1/32; H01J 37/20; H01J 2237/2007; H01J 2237/2809; H01J 2237/204; H01J 2237/3151
    See application file for complete search history.

(56) References Cited

U.S. PATENT DOCUMENTS

| | | | | |
|---|---|---|---|---|
| 5,472,566 A | * | 12/1995 | Swann | ...................... G01N 1/32 |
| | | | | 156/345.39 |
| 2006/0289386 A1 | * | 12/2006 | Tysoe | ................ H01L 21/31111 |
| | | | | 73/705 |
| 2016/0030941 A1 | | 2/2016 | Lihl et al. | |
| 2016/0126057 A1 | | 5/2016 | Kaneko et al. | |

(Continued)

FOREIGN PATENT DOCUMENTS

| | | |
|---|---|---|
| DE | 112014002250 T5 | 2/2016 |
| JP | H10134749 A | 5/1998 |

(Continued)

*Primary Examiner* — David E Smith
*Assistant Examiner* — Hsien C Tsai
(74) *Attorney, Agent, or Firm* — LEYDIG, VOIT & MAYER, LTD.

(57)          ABSTRACT
A sample holder includes a main component comprising a first surface area, and a retaining mechanism comprising a holding component. The retaining mechanism is configured to retain a sample between the holding component of the retaining mechanism and the first surface area in a closed state of the retaining mechanism. The retaining mechanism is further configured to enter an opened state upon mechanical actuation of the retaining mechanism. The opened state allows insertion and removal of the sample. The retaining mechanism is further configured to revert to the closed state once the mechanical actuation is removed.

15 Claims, 9 Drawing Sheets

(56) References Cited

U.S. PATENT DOCUMENTS

| | | | |
|---|---|---|---|
| 2020/0273659 A1 * | 8/2020 | van den Boogaard . | H01J 37/20 |
| 2022/0020558 A1 | 1/2022 | Kataoka et al. | |
| 2022/0051870 A1 | 2/2022 | Kataoka et al. | |
| 2022/0319802 A1 | 10/2022 | Nakamura et al. | |

FOREIGN PATENT DOCUMENTS

| | | | | |
|---|---|---|---|---|
| JP | H1167131 A | 3/1999 | | |
| KR | 20130060406 A | 6/2013 | | |
| TW | 200928160 A | 7/2009 | | |
| WO | WO-2013121938 A1 * | 8/2013 | .......... | H01J 37/3056 |
| WO | WO 2021059401 A1 | 4/2021 | | |

* cited by examiner

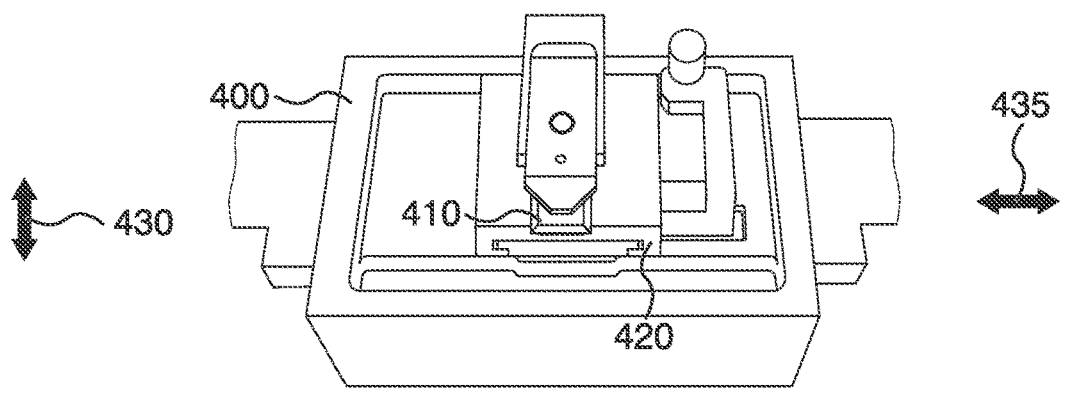
Fig. 4a
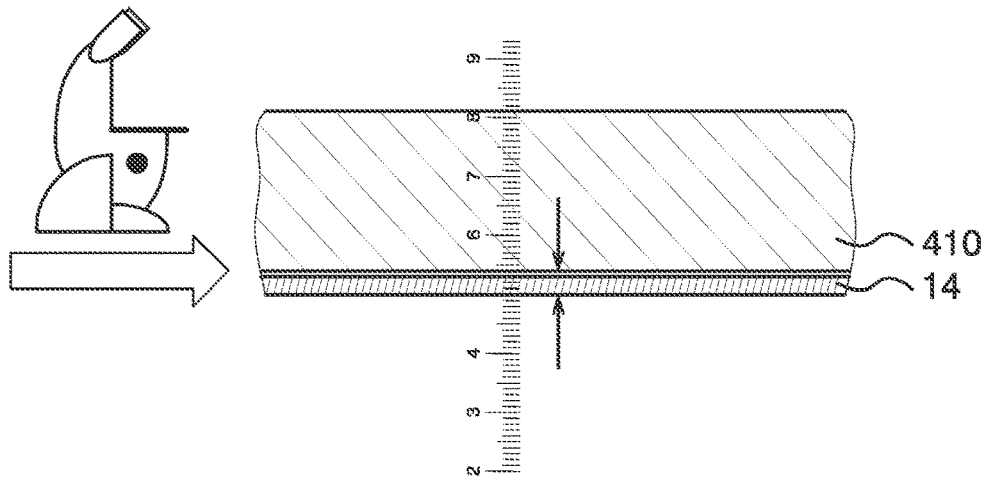
Fig. 4b
Fig. 4c

1

SAMPLE HOLDER, LOADING DEVICE, AND METHOD FOR INSERTING A SAMPLE INTO A SAMPLE HOLDER

CROSS REFERENCE TO RELATED APPLICATIONS

This application claims benefit to European Patent Application No. EP 22175165.4, filed on May 24, 2022, which is hereby incorporated by reference herein.

FIELD

Embodiments of the present disclosure relate to a sample holder, to a loading device, and to a method for inserting a sample into a sample holder.

BACKGROUND

Ion beam cutting and polishing is an established process for preparing samples (i.e., specimens) for electron microscopy. This process has the advantage that no mechanical stress is applied to the sample. The process is suitable for samples from many different application areas, e.g., lithium-ion batteries (LiBs), to name one example. LiB films are composed of hard soft and brittle materials. In contrast to ion etching, relevant microscopic structures or pores cannot be exposed by mechanical cutting or polishing.

For ion beam processing, a mask (i.e., a shielding plate) is aligned with the edge of the sample in such a way that it shades the sample up to the height at which it is to be prepared. The mask and sample are then placed in a vacuum chamber. An ion beam is directed at the mask in such a way that part of the beam is shadowed by the mask and the other part ablates the sample material to the mask edge by physical sputtering.

During this process, heat is introduced via the ion beam. This can lead to deformation or even damage (due to melting) of the sample. For heat-sensitive samples, additional cooling of the mask and sample may therefore be applied.

Many sample types must be kept under vacuum or protective atmosphere (e.g., LiBs) to avoid reaction of the material with the ambient air. Therefore, it may be necessary to mount the sample and mask in the holder even under difficult conditions, for example inside a glove box. Finally, it may be desired that a sample holder for this application offers the possibility of a direct transfer into the electron microscope without the need to relocate the sample, which in turn involves the risk of damaging the final prepared sample.

Patent documents WO 2021/059401 A1, DE 11 2014 002 250 T5, US 2022/0051870 A1 and US 2022/0020558 A1 relate to sample holders for use in ion mills. Inserting the sample into the holder poses a challenge, especially when used in difficult conditions (e.g., inside a glove box). Also, setting the protrusion of the holder above the edge of the mask/shielding plate is imprecise and, for example, difficult to achieve at all within a glove box. Moreover, cooling of the sample may be inadequately addressed by the above-referenced sample holders.

There may be a desire for an improved concept for handling a sample.

SUMMARY

Embodiments of the present invention provide a sample holder. The sample holder includes a main component comprising a first surface area, and a retaining mechanism comprising a holding component. The retaining mechanism is configured to retain a sample between the holding component of the retaining mechanism and the first surface area in a closed state of the retaining mechanism. The retaining mechanism is further configured to enter an opened state upon mechanical actuation of the retaining mechanism. The opened state allows insertion and removal of the sample. The retaining mechanism is further configured to revert to the closed state once the mechanical actuation is removed.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIGS. 4a, 4b and 4c show schematic diagrams of a process for aligning a mask with a sample in preparation of an ion milling process according to an embodiment;

DETAILED DESCRIPTION

Figure 1A:
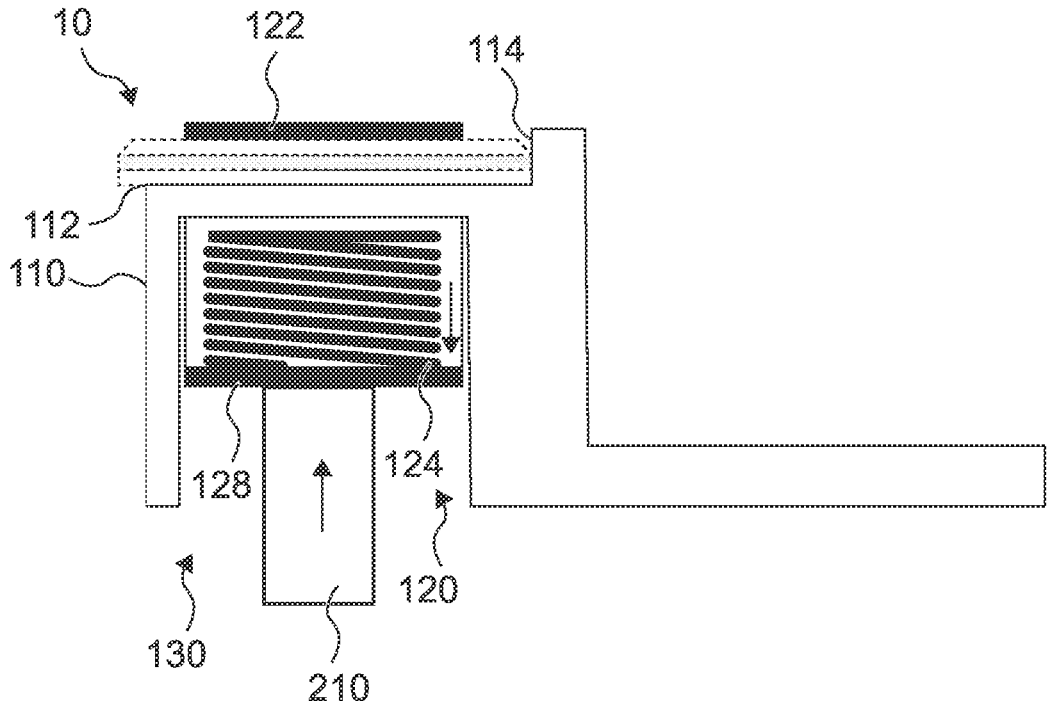
FIGS. 1a and 1b show schematic diagrams of a sample holder according to an embodiment.

Various embodiments of the present disclosure are based on the finding, that the handling of samples is desired to be quick and easy, which may both reduce the time required by the user to perform the sample insertion process and increase the quality and success rate of the sample preparation. According to embodiments of the present disclosure, the handling of the sample may be improved by providing a sample holder (i.e., specimen holder) with a retaining mechanism (i.e., a mechanism that is configured to retain the sample within the sample holder) that can be opened by mechanical actuation, and that automatically reverts to a closed state when the mechanical actuation is removed. For example, the mechanical actuation may be provided by a loading device, which may also facilitate loading of the sample holder by providing a guide rail for inserting the sample into the sample holder. Both the sample holder with the retaining mechanism and the loading device, which may be used to provide the mechanical actuation, may facilitate and speed up the insertion of the sample into the sample holder, thus reducing the time required and potentially increasing the quality and success rate of the sample preparation.

Various aspects of the present disclosure relate to a sample holder. The sample holder comprises a main component comprising a first surface area. The sample holder further comprises a retaining mechanism comprising a holding component. The retaining mechanism is configured to retain a sample between the holding component of the retaining mechanism and the first surface area in a closed state of the retaining mechanism. The retaining mechanism is configured to enter an opened state upon mechanical actuation of the retaining mechanism. The opened state allows insertion and removal of the sample. The retaining mechanism is configured to revert to the closed state once the mechanical actuation is removed. By opening in response to the mechanical actuation and reverting to the closed state once the mechanical actuation is removed, insertion of the sample into the sample holder is facilitated, thus reducing the time required and potentially increasing the quality and success rate of the sample preparation.

As outlined above, the sample holder may be used in conjunction with a loading device, which may be provided to actuate the retaining mechanism. For example, the retaining mechanism may be configured to enter the opened state upon mechanical actuation of the retaining mechanism by a mechanical component of the loading device. This may further facilitate insertion of the sample into the sample holder, as the actuation of the retaining mechanism is supported by the loading device.

The sample holder and the loading device may be designed in parallel, such that the mechanical component included in the loading device is automatically aligned with the respective component of the retaining mechanism of the sample holder once the sample holder is attached (e.g., fixed) to the loading device. The sample holder may comprise an interface for receiving the mechanical component of the loading device when the sample holder is attached to the loading device. In other words, the sample holder may be designed such, that the interface is aligned with the mechanical component when the sample holder is attached to the loading device.

The automatic reversion of the retaining mechanism may be implemented using an elastic element, such as spring. For example, the retaining mechanism may comprise a spring, with the spring being compressed when the retaining mechanism is actuated. The spring, in its preloaded state, may press the holding component of the retaining mechanism towards the first surface area of the main component, thereby clamping the sample in between the holding component and the first surface area. Thus, the spring may provide the automatic reversion to the closed state once the mechanical actuation is removed.

According to various embodiments, instead of only inserting the sample into the sample holder, the sample may be inserted between two supporting layers, to support thin and/or brittle samples. The retaining mechanism may be configured to retain a stack of layers comprising the sample. The first surface area may be provided to form a first border area with a longitudinal surface area of the stack of layers. The main component may further comprise a second surface area provided to form a second border area with a transverse surface area of the stack of layers. The stack of layers may be pressed against the first surface area (in the closed state of the retaining mechanism), which may, through the increased mechanical friction, retain the stack of layers within the sample holder. The second surface area may be used to align the stack of layers within the sample holder. For example, the stack of layers may be slid into the sample holder until the stack of layers is pressed against the second surface area, thus aligning both the stack of layers with the sample holder and the layers of the sample holder with each other.

According to various embodiments, the main component may comprise a fixing arrangement for fixing the sample holder to the loading device (or to a sample stage). This may support the alignment of the sample holder with the mechanical component and with an (optional) guide rail for inserting the sample into the sample holder.

As outlined above, various embodiments of the present disclosure relate to a concept for holding a stack of layers during an ion milling process, e.g., as preparation for electron microscopy. Accordingly, the sample holder may be suitable for holding a stack of layers comprising the sample during the ion milling process. In general, such samples are small. For example, the stack of layers may have a vertical height of at most 10 mm (or at most 5 mm, or at most 2 mm). Accordingly, a vertical distance between the holding component of the retaining mechanism and the first surface area may be at most 10 mm (or at most 5 mm, or at most 2.5 mm) in the opened state of the retaining mechanism.

In general, the sample holder may enclose a major portion of the sample or stack of layers comprising the samples. Accordingly, to cool the sample, the cooling may be applied via the sample holder. In the proposed concept, the sample or stack of layers is pressed against the first surface area. For example, at least the first surface area may comprise a metal, such as copper, with a thermal conductivity of at least 250 W/m*K. This may support cooling of the sample. Other components, such as the holding component and/or the spring of the retaining mechanism may likewise comprise such a metal.

Various embodiments of the present disclosure relate to a loading device for a sample holder, e.g., for the sample holder introduced above. The loading device comprises a mechanical component for actuating a retaining mechanism of the sample holder to put the retaining mechanism of the sample holder into an opened state. The opened state allows insertion of the sample into, and removal of the sample from, the sample holder. As outlined in connection with the sample holder, the loading device may further facilitate insertion of the sample into the sample holder, as the actuation of the retaining mechanism is supported by the loading device.

In some configurations, the mechanical component may be a movable mechanical component. For example, the loading device may comprise a mechanism for moving the movable mechanical component. This way, the retaining mechanism of the sample holder may be actuated, and the actuation may be removed, while the sample holder is attached to the loading device.

For example, a lever and an eccentric element may be used to move the movable mechanical component, and thus actuate the retaining mechanism. The mechanism may comprise the lever and the eccentric element. The lever may be configured to turn the eccentric element, and the eccentric element may be configured to move the moveable mechanical component. Such a lever may be easy to use, even in a glove box.

The loading device may comprise further affordances for aligning the sample holder with the loading device and/or for inserting the sample into the sample holder. For example, the loading device may comprise a first recess for receiving the sample holder. For example, the first recess may be used to align the sample holder with the holding device in a first lateral dimension. The loading device may further comprise a stopping surface area that is arranged such, that when the sample holder is inserted into the first recess up to the stopping surface area, the sample holder is aligned with the mechanical element. This may facilitate alignment of the sample holder with the loading device in a second lateral dimension. For example, this two-dimensional alignment may align the sample holder (and in particular the interface of the retaining mechanism) with the mechanical component of the loading device.

Another affordance relates to the process of sliding the sample into the sample holder. For example, the loading device may comprise a second recess for guiding insertion of the sample, such as a stack of layers comprising the sample, into the sample holder. This may further facilitate the insertion process.

The combination of the first recess, the stopping surface area and the second recess may thus facilitate the sample insertion process. For example, the sample holder may be inserted into the first recess and slid towards the stopping surface area until it is pressed against the stopping surface area. At this position, the sample holder may be aligned with the mechanical component. For example, the sample holder may be fixed to the loading device to stay in this position. After actuating the retaining mechanism, the second recess may be used to guide insertion of the sample into the sample holder. Mechanically, this may be achieved by arranging the two recesses at different heights. For example, the loading device may comprise a first portion having a first vertical height and a second portion having a second vertical height. The first portion may comprise the first recess and the second portion may comprise the second recess. The second vertical height may be greater than the first vertical height. For example, the sample holder may be slid, guided by the first recess, towards the second portion of the loading device. Once the sample holder presses against the second portion, the second recess, which may be at a vertical height that is aligned with the first surface area when the sample holder is inserted into the first recess, may be used to slide the sample into the sample holder, guided by the second recess. In effect, the stopping surface area referenced above may be provided by a surface area of the second portion facing the first portion. In other words, a surface area of the second portion facing towards the first portion may comprise the stopping surface area for aligning the sample holder with the mechanical component.

In some embodiments, the loading device further comprises a thread for receiving a screw or bolt for fixing the sample holder to the loading device. Once the sample holder is fixed to the loading device, alignment with the mechanical component and with the second recess may be maintained.

Some aspects of the present disclosure relate to a method for inserting a sample into a sample holder for holding the sample during an ion milling process. The method comprises placing the sample between a first and a second support layer to form a stack of layers comprising the sample. The method comprises inserting the stack of layers into the sample holder. By using a stack of layers, brittle and/or thin samples may be held stable during the ion milling process and during the insertion process.

In general, the first and second support layer may not only provide additional stability during the ion milling process and during the insertion process but may also facilitate a removal of excess material. For example, the method may comprise cutting off excess material of the sample at the edge of the first and second support layer after placing the sample between the first and second support layer. Thus, the sample does not have to be precisely cut into shape before insertion, which may further facilitate preparation of the sample. For example, the excess material of the sample may be cut off after inserting the stack of layers into the sample holder. For example, alignment between the layers may be enforced by the sample holder, e.g., by the surface areas and/or by a retaining mechanism of the sample holders such that precise cutting of the excess material is facilitated.

For example, as outlined in connection with the sample holder introduced above, the sample holder may comprise a main component with a first surface area for receiving a longitudinal surface area of the stack of layers and a retaining mechanism. The act of inserting the stack of layers into the sample holder may comprise sliding the stack of layers into an opening between the first surface area of the main component and a holding component of the retaining mechanism. For example, once the stack of layers is inserted into the sample holder, the retaining mechanism may be put into a closed state, in which the retaining mechanism may clamp the stack of layers towards the first surface area, thus retaining the stack of layers within the sample holder.

In some embodiments, the main component of the sample holder may further comprise a second surface area for receiving a transverse surface area of the stack of layers. The act of inserting the stack of layers into the sample holder may comprise sliding the stack of layers into the opening between the first surface area and the holding component until the stack of layers is pressed against the second surface area of the main component. For example, the second surface area may be used to align the stack of layers with the sample holder and the layers of the stack of layers among themselves.

As outlined in connection with the sample holder, the retaining mechanism may have two states—an opened state, in which the stack of layers can be inserted, and a closed state, in which the stack of layers are retained by the retaining mechanism. To toggle between the two states, the retaining mechanism may be actuated mechanically. Accordingly, the method may comprise actuating the retaining mechanism of the sample holder to enter the retaining mechanism into the opened state to provide the opening between the first surface area and the holding component. The stack of layers may be inserted into the sample holder while the retaining mechanism is in the opened state. In other words, the retaining mechanism may be (temporarily) actuated, to allow easy insertion of the stack of layers into the sample holder.

To facilitate this actuation, a loading device, such as the aforementioned loading device, may be used. For example, the method may comprise attaching the sample holder to the loading device. The method may comprise moving a movable mechanical component of the loading device to actuate the retaining mechanism of the sample holder to enter the retaining mechanism into the opened state. For example, the act of moving the mechanical component may comprise turning a lever of the loading device to turn an eccentric element that moves the movable mechanical component of the loading device, thus actuating the retaining mechanism of the sample holder. This may facilitate opening (and closing) the retaining mechanism, and thus facilitate the sample insertion process.

Once the stack of layers is inserted into the sample holder, the sample holder may be removed from the loading device and inserted into a sample stage (being used for alignment and/or for the ion milling process). For example, the method may comprise inserting the sample holder with the stack of layers into a sample stage and aligning the stack of layers with a mask for use in the ion milling process. For example, aligning the stack of layers with the mask comprises aligning the stack of layers with the mask in a first and a second dimension, followed by rotating the sample stage and aligning the stack of layers with the mask in a third dimension. By rotating the sample stage with the sample holder, alignment with the mask in the third dimension is feasible with the same microscope as the alignment in the first and second dimension.

In some embodiments, one of the support layers may comprise slanted edges, which may facilitate the alignment process. For example, one of the first and second support layer may comprise slanted edges for aligning the stack of layers with a mask during the ion milling process. For example, to make the process more economical, re-use of the respective support layer may be enabled by two or more slanted edges, e.g., by providing a laterally square support layer with four slanted edges. In this case, the support layer may be used four times before a new support layer is required.

As outlined in connection with the sample holder, a major consideration during the ion milling process is the cooling of the sample. The method may comprise ion milling the sample. Cooling may be applied to the sample during the ion milling process via the first and second support layer and a surface area of the sample holder. For example, the support layers may be metallic support layers, which may provide improved heat conduction, and thus heat dissipation and application of the cooling. This may protect samples that are sensitive to heat damage.

Various embodiments will now be described more fully with reference to the accompanying drawings. In the figures, the thicknesses of lines, layers and/or regions may be exaggerated for clarity.

In the following, a sample holder, a loading device, and a method for inserting a sample into a sample holder will be described in more detail with reference to the enclosed figures. Moreover, an application of the proposed sample holder, loading device and method with respect to the preparation of samples for observation through a scanning electron microscope are presented.

In order to accurately image the structure of a sample in a scanning electron microscope, it is desired that the sample being prepared be free of artefacts introduced during the preparation. A proven, universally applicable method is to cut and polish the surface of the sample with a broad ion beam. When such ion beam cutting and polishing is used, no mechanical stress might be exerted on the sample. However, the ion beam may heat up the sample. To avoid thermal damage, the holder can be cooled during processing.

Such a preparation process is particularly suitable for the preparation of sensitive battery foils. To avoid damage to such samples, care may be taken to ensure that they remain mechanically and chemically intact. The proposed sample holder, loading device and method may provide an improved concept for preparing a sample for such an ion milling process.

Figure 1B:
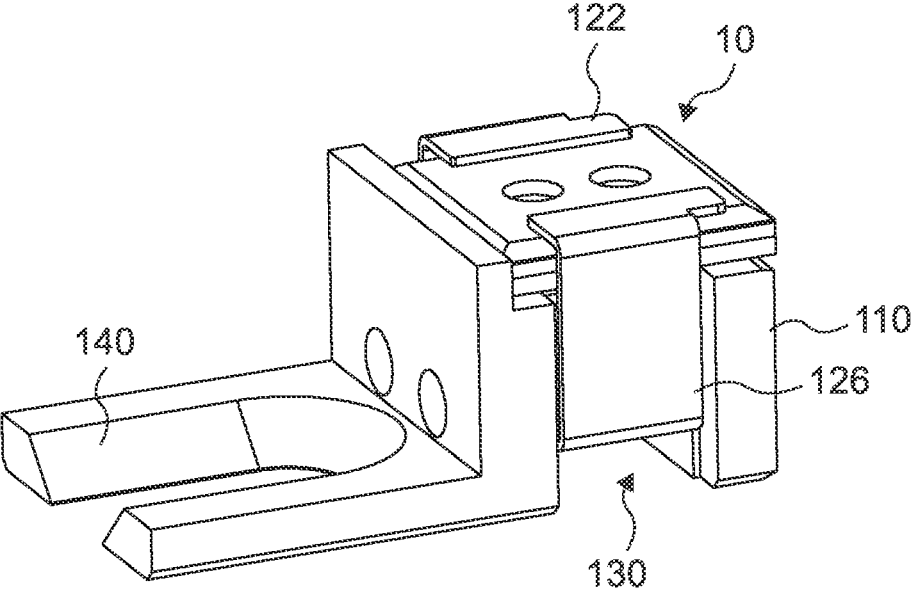

FIGS. 1a and 1b show schematic diagrams of examples of a sample holder 100. In FIG. 1a, a side view of the sample holder 100 is shown, while FIG. 1b shows an isometric view. The sample holder 100 comprises a main component 110 with a first surface area 112. The sample holder comprises a retaining mechanism 120 with a holding component 122. The retaining mechanism 120 is configured to retain a sample 14 between the holding component 122 of the retaining mechanism and the first surface area 112 in a closed state of the retaining mechanism. The retaining mechanism is configured to enter an opened state upon mechanical actuation of the retaining mechanism. The opened state allows insertion and removal of the sample. The retaining mechanism is configured to revert to the closed state once the mechanical actuation is removed.

The proposed sample holder comprises two components: the main component 110 (also denoted "holding block"), which may be a block of metal, and the retaining mechanism 120, which may comprise one or more (metal) components that are movable (or compressible) relative to the main component. For example, the main component may be a machined or molded (single) block of metal, which may host the other component or components of the sample holder. The retaining mechanism 120 may be separate but attached to the main component 110, or it may be entirely separate from the main component. For example, as shown in FIG. 1a, the retaining mechanism 120 may comprise the holding component 122 and a spring 124. The spring 124 may be attached to the main component 110 and/or a bottom component 128 of a clamp comprising the holding component 122, e.g., by welding, glue, form fitting or force fitting. Alternatively, the spring 124 might not be attached to the main component 110 and/or the bottom component 128. For example, the spring 124 might be merely jammed between the main component 110 and the bottom component 128 of the clamp.

Figure 1C:
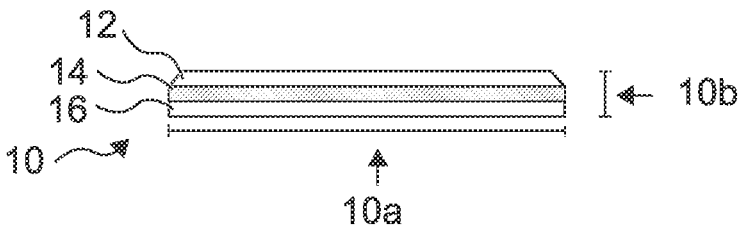
FIG. 1c shows a schematic diagram of a stack of layers comprising a sample according to an embodiment.
Figure 1D:
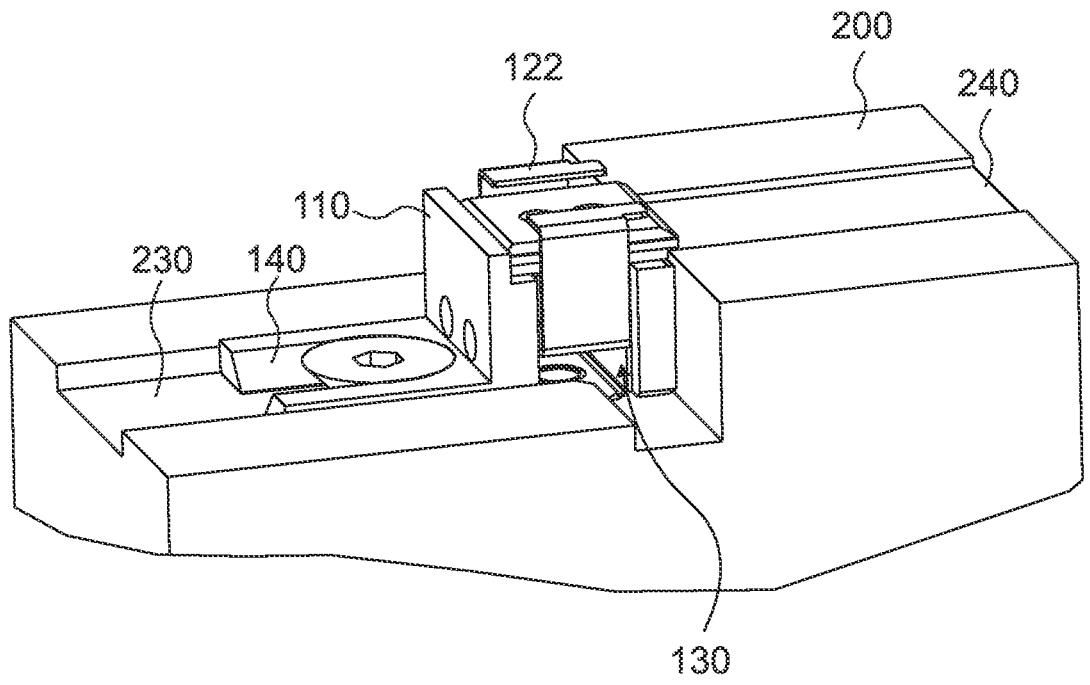
FIG. 1d shows a schematic diagram of a sample holder that is fixed to a loading device according to an embodiment.

In the example shown in FIGS. 1a, 1b and 1d, the holding component 122 is part of a bent piece of metal (also denoted "clamp") comprising the holding component 122, a side component 126 and the bottom component 128. The clamp may comprise or consist of a thin, well heat-conducting, bent sheet metal, which may enclose the main component. It may have an opening on the front side, i.e., between two portions of the holding component. The clamp may be used to press the sample or stack of layers comprising the sample evenly, on both sides, onto the main component via the spring. For example, the spring 124 may be compressed when the retaining mechanism is actuated. The spring 124 is arranged vertically between the bottom component 128 of the bent piece of metal and the main component 110. In the context of the present disclosure, the vertical dimension may be defined perpendicular to the first surface area 112. Correspondingly, the lateral dimension may be defined parallel to the first surface area 112. As shown in FIG. 1a, the spring 124 in its preloaded (e.g., normal) state presses the holding component 122 of the retaining mechanism towards the first surface area 112 of the main component, thereby clamping the sample 14 (which is part of a stack of layers 10 in FIGS. 1a, 1b and 1d) in between the holding component 122 and the first surface area 112. The side component 126 of the bent piece of metal, and a second surface area 114 of the main component 110 may further constrain a lateral movement of the sample 14.

The retaining mechanism 120 has two states—an opened state, which allows insertion of the sample into the sample holder, and a closed state, where the sample is retained within the sample holder, and in particular between the holding component 122 and the first surface area 112. For example, the retaining mechanism 120 may be configured to retain the sample or stack of layers comprising the sample in its closed state, and to release the sample or stack of layers in its opened space. In this context, "retaining" means that the sample or stack of layers comprising the sample is held back, held tight and/or clamped between the holding component and the first surface area, e.g., such that the sample or stack of layers cannot be moved or removed without application of excessive force in the closed state of the retaining mechanism 120. Correspondingly, "releasing" means that the sample or stack of layers is let loose, such that the sample or stack of layers can be moved can be moved with little effort in the opened state of the retaining mechanism.

In the proposed concept, the sample holder is suitable for small and/or thin samples. FIG. 1c shows a schematic diagram of an example of the stack of layers comprising the sample. For example, as shown in FIG. 1c, the sample may be a film-shaped sample 14, which may be placed between a first 12 and a second 16 support layer (i.e., plate) to form the stack of layers comprising the sample 14. In other words, the sample may be placed (e.g., inserted, clamped) between two support layers, thus creating a "sample sandwich". Accordingly, the sample holder may be suitable for holding a stack of layers comprising the sample during an ion milling process. The retaining mechanism may be configured to retain the stack of layers 10 comprising the sample 14. The sample holder may thus be a device for holding fragile and temperature-sensitive samples for use in particle beam systems. Through the use of a stack of layers, and the assistance provided by the retaining mechanism there is no need to fix or even embed the holder with adhesive.

In various examples, the sample 14 may be a sample foil, such as a foil of a Lithium-ion battery. Accordingly, the vertical opening provided by the retaining mechanism in the opened state may be small, e.g., having a vertical height of at most 10 mm. For example, the vertical distance between the holding component of the retaining mechanism and the first surface area may be at most 10 mm (or at most 5 mm, or at most 2.5 mm) in the opened state of the retaining mechanism. Thus, the sample holder may be suitable for a sample or a stack of layers having a vertical height less than 10 mm (or less than 5 mm, or less than 2.5 mm). In the aforementioned example of the foil of the Lithium-ion battery, the resulting stack of layers has a vertical height of approximately 2 mm.

In order not to damage the sensitive holder material, care may be taken to uniformly apply force when clamping the holder. In other words, the force may be supplied uniformly on the sample. This may be ensured by placing the sample between the two support layers, which may help distribute the force across the sample, and/or by using a holding component 122 with a large area. For example, the holding component 122 may cover at least 25% (or at least 30%, or at least 40%, or at least 50%) of a surface area portion (facing towards the holding component 122) of the support layer being arranged between the sample and the holding component 122 when the stack of layers is inserted into the sample holder.

As shown in FIGS. 1a to 1d, one of the support layers (e.g., the support layer that is destined to face the ion beam) may have slanted edges, i.e., the support layer may be chamfered at an angle. In other words, one of the first and second support layer may comprise slanted edges for aligning the stack of layers with a mask during the ion milling process. This slanted edge or chamfer facilitates alignment with a mask during the preparation. Said support layer (facing towards the ion beam, and thus away from the first surface area) may be symmetrical, e.g., having a square lateral shape with the same slanted edges on all four sides. Accordingly, the other layers of the stack of layers may also have a square lateral shape. It wears off during the preparation process. Due to the symmetry, it may be used four times (on the four chamfered edges) and must then be replaced.

In various examples, care is taken to support cooling of the sample during the ion milling process. For this reason, the main component 110, the retaining mechanism 120 and/or the support layers may be made from, or comprise, metal, for example metal that is highly thermally conductive. For example, at least the first surface area (e.g., at least one of the first surface area, the entire main component, the holding component, the spring, the side component, and the bottom component) may comprise a metal with a thermal conductivity of at least 250 W/m*K, such as copper, silver, or gold. Both the sample holder and the beam-shielding mask can be cooled actively to sufficiently cool heat-sensitive samples.

The sample, or stack of layers comprising the sample, is placed on the first surface area 112 of the main component. As a result, the first surface area may be provided to form a first border area with a longitudinal surface area 10a (shown in FIG. 1c) of the sample or of the stack of layers, with the longitudinal surface area 10a facing the first surface area 112. In some examples, the first surface area 112 on which the sample or stack of layers is placed may be smooth. In this case, the sample or stack of layers may be constrained, in both directions of a first lateral dimension, by the side component(s) of the retaining mechanism and may remain unconstrained in a second lateral dimension (being perpendicular to the first lateral dimension). Alternatively, a stop may be included adjacent to the first surface area, against which the sample or stack of layers (i.e., sample sandwich) may be pushed. In other words, the main component may further comprise a second surface area 114 provided to form a second border area with a transverse surface area 10b (shown in FIG. 1c) of the sample or stack of layers, with the transverse surface area 10a facing the second surface area 114. The second surface area 114 may be provided by a portion of the main component 110, such as a rim of the main component 110, which may be provided to constrain movement of the sample or stack of layers in one direction of the second lateral dimension, thus providing a stop for the sample or stack of layers when the sample or stack of layers is slid in between the holding component 122 and the first surface area 112.

In order to simplify the secure mounting of the sample, the proposed concept uses the (spring-based) retaining mechanism introduced above. To further facilitate the process, the retaining mechanism may be used in combination with a special mounting aid, which is denoted "loading device", which may be is particularly easy to handle (even under difficult conditions). Such a loading device 200 is shown in FIGS. 1d and 1n FIGS. 2a to 2i. FIG. 1d shows a schematic diagram of an example of a sample holder 100 that is fixed to a loading device 200, and of a system comprising the loading device 200 and the sample holder 100. One possible task for such a loading device 200 is the actuation of the retaining mechanism 120. As outlined above, the retaining mechanism is configured to enter an opened state upon mechanical actuation of the retaining mechanism, and to revert to the closed state once the mechanical actuation is removed. This mechanical actuation may be provided by the loading device. For example, the retaining mechanism may be configured to enter the opened state upon mechanical actuation of the retaining mechanism by a mechanical component 210 of the loading device 200. In other words, the loading device may comprise the mechanical component 210, which may be a piston, which may be configured to actuate the retaining mechanism 120 when the sample holder 100 is attached to the loading device 100. For example, the retaining mechanism 120 may be actuated by the mechanical component 210 pushing against the bottom component 128 of the retaining mechanism 120, thus compressing the spring 124. The sample holder may comprise an interface 130, such as a recess or opening, for receiving the mechanical component of the loading device when the sample holder is attached to the loading device. More details on the mechanical component 210, and thus the actuation of the retaining mechanism 120, is shown in connection with FIGS. 2a to 2i. However, the actuation of the retaining mechanism 120 is not generally limited to being performed by a loading device. In more general terms, the retaining mechanism 120 may be designed to be actuated with or without a loading device, e.g., by including a surface area, such as the bottom component 128, that is suitable for a manual compression of the spring 124 of the retaining mechanism 120.

To support the mounting/loading process, the sample holder 100 may be fixed (i.e., attached) to the loading device. Accordingly, the main component may further comprise a fixing arrangement 140, such as a recess or hole, for fixing the sample holder to a loading device 200 or to a sample stage, e.g., with the help of a screw or bolt 255 (shown in FIGS. 2c and 2d, for example). The main component 110 shown in FIG. 1b, has a milling 140 (e.g., a recess) that allows the sample holder to be fixed in the instrument (e.g., in a sample stage) or on the loading device 200 (shown in FIG. 1d). For example, as shown in FIGS. 1b and 1d, the main component 110 may comprise a U-shaped recess (with angled edges) for receiving a screw or bolt.

The simplified handling and design of the sample holder may help maintain the integrity of thin, unstable, and fragile samples from insertion into the sample holder throughout the preparation process to insertion into the electron microscope. This may save time, prevent sample loss, and may reproducibly support high quality sample preparation.

More details and aspects of the sample holder, loading device and sample are mentioned in connection with the proposed concept or one or more examples described above or below (e.g., FIGS. 2a to 4e). The sample holder, loading device and sample may comprise one or more additional optional features corresponding to one or more aspects of the proposed concept, or one or more examples described above or below.

Figure 2A:
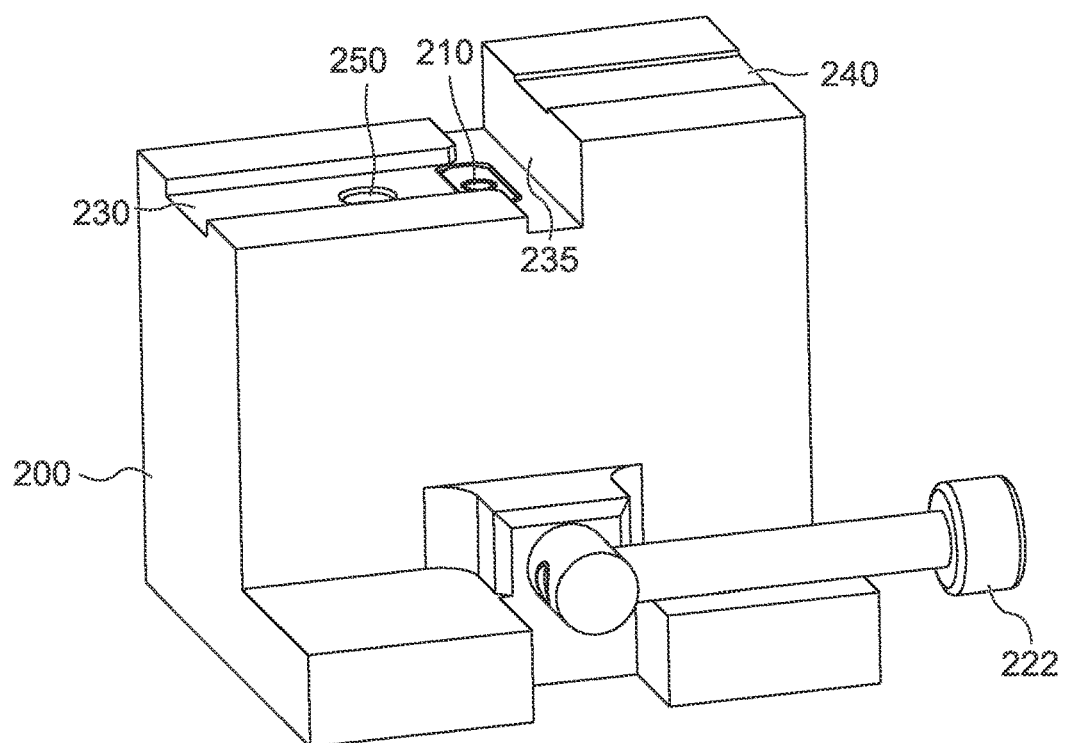
FIG. 2a shows a schematic diagram of a loading device for a sample holder according to an embodiment.

FIG. 2a shows a schematic diagram of an example of a loading device 200 (i.e., loading device) for a sample holder 100, e.g., for the sample holder 100 shown in connection with FIGS. 1a to 1d. The loading device 200 comprises a mechanical component 210 for actuating a retaining mechanism of the sample holder to put the retaining mechanism of the sample holder into an opened state, the opened state allowing insertion of the sample into, and removal of the sample from, the sample holder.

In connection with FIGS. 1a to 1d, the use of the loading device 200 in combination with the sample holder 100 is shown. To insert the sample into the sample holder, the sample holder may be placed on the loading device. A mechanism (which may comprise the mechanical component 210) in the loading station may be used to compress the spring 124 of the retaining mechanism 120 of the sample holder 100, thereby moving the clamp with the holding component 122 away from the holding block (i.e., the main component). This creates a free space into which the sample or stack of layers (i.e., the sample sandwich) can be inserted. Now the sample or stack of layers can simply be pushed between the holding component 122 and the first surface area 112. After the mechanism has been released, the spring relaxes and the sample or stack of layers is fixed to the holding block (i.e., the main component) via the clamp (e.g., by the holding component 122 of the clamp). Now protruding sample material can be cut off above the rear support plate to obtain a smooth edge for the following preparation.

To actuate the retaining mechanism, the mechanical component 210 is used. In particular, as will be shown in connection with FIGS. 2a to 2i, a movable mechanical component 210 may be used, i.e., the mechanical component 210 may move relative to the sample holder and/or relative to other components of the loading device 210. In other words, the mechanical component may be a movable mechanical component. For example, as will become evident in connection with FIGS. 2d and 2f, the mechanical component 210 may a piston that is configured to move towards and away from the sample holder (when the sample holder is attached to the loading device), alternating between actuating the retaining mechanism (thus putting the retaining mechanism in the opened state, e.g., by compressing the spring 124) and not actuating the retaining mechanism (thus putting the retaining mechanism in the closed state, e.g., by ceding to exert force on the spring 124, so that the spring reverts to its preloaded state). To provide the movement of the mechanical component 210, the loading device 200 may comprise a mechanism 220 for moving the movable mechanical component.

In the examples shown in FIGS. 2a to 2i, the movable mechanical component is turned by an eccentric element 224 (shown in FIGS. 2d, 2f and 2i), with the eccentric element being turned by a lever 222. In other words, the mechanism for moving the movable mechanical component 210 may comprise a lever 222 and an eccentric element 224, with the lever being configured to turn the eccentric element and the eccentric element being configured to move the moveable mechanical component.

The procedure for inserting the sample (or stack of layers comprising the sample) is now illustrated with reference to FIGS. 2a to 2i.

In FIG. 2a, the loading device 200 is shown without the sample holder 100, e.g., before or after the sample holder 100 is attached to the loading device 200. FIG. 2a shows the loading device 200 with the movable mechanical component 210 (in a retreated position), the lever 222, a first recess (or groove) 230, a stopping surface area 235, a second recess 240, and a thread 250 for a screw or bolt. The purpose of the first recess 230, the stopping surface area 235, the second recess 240 and the thread 250 will become evident in the following.

Figure 2B:
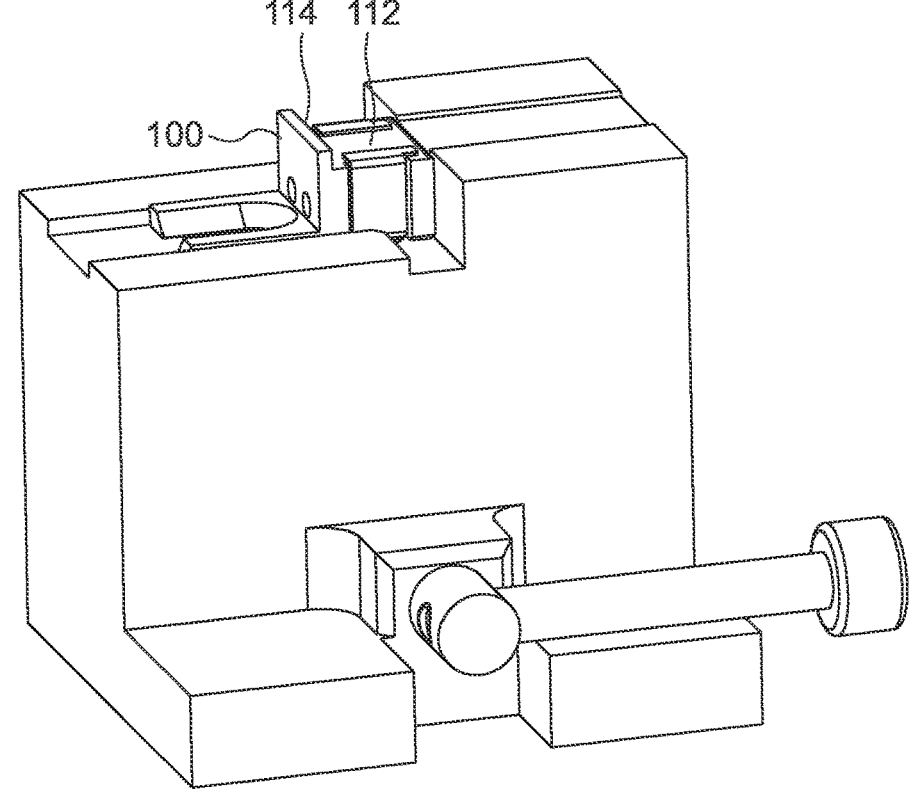
FIGS. 2b and 2c show schematic diagrams of a loading device with a sample holder, before insertion of the sample into the sample holder and with a retaining mechanism of the sample holder being in a closed state, according to an embodiment.
Figure 2C:
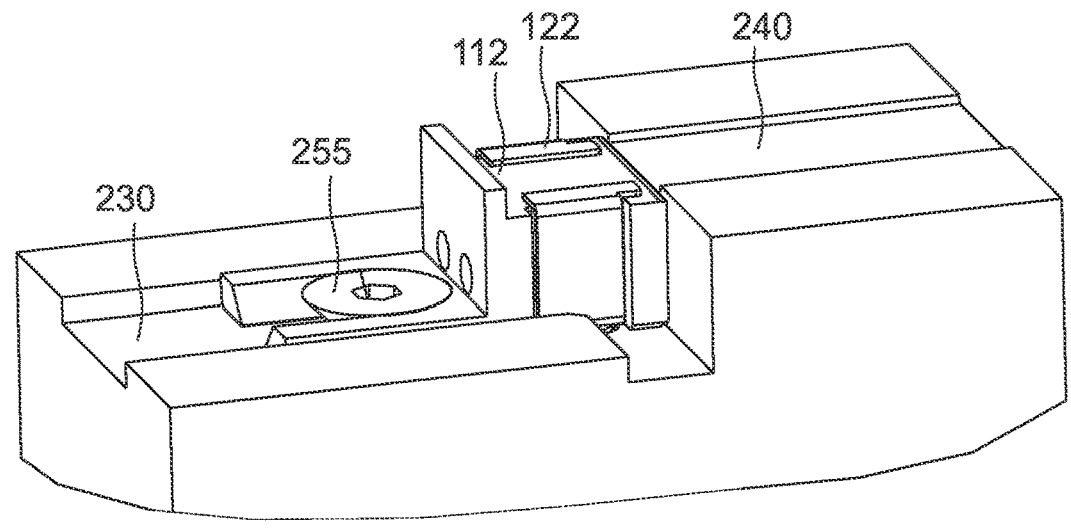

FIGS. 2b and 2c show schematic diagrams of examples of the loading device with the sample holder 100. In FIG. 2b, the sample holder 100 is placed in the first recess 230, which is configured to receive the sample holder 100. In particular, the first recess 230 may be used to guide the sample holder 230 towards alignment with the mechanical component 210. For example, the sample holder may be inserted into the first recess and slid towards the stopping surface area 235 (as shown in FIG. 2a) until it is pressed against the stopping surface area 235, where it is (laterally) aligned with the mechanical component. The stopping surface area 235 is arranged such, that when the sample holder is inserted into the first recess up to the stopping surface area, the sample holder is aligned with the mechanical element. In FIG. 2b, the sample holder is shown in the position where it is aligned with the mechanical component, before insertion of the sample into the sample holder and with the retaining mechanism of the sample holder being in the closed state.

Once in this position, the sample holder may be fixed (e.g., attached) to the loading device to keep the alignment. For this purpose, the thread 250 may be used. The thread 250 may be suitable for receiving a screw or bolt 255 for fixing the sample holder to the loading device. The screw or bolt 255 (shown in FIG. 2c) may be inserted through the recess 140 of the sample holder 100 into the thread 250, thus fixing (i.e., attaching, fastening) the sample holder to the loading device.

Figure 2D:
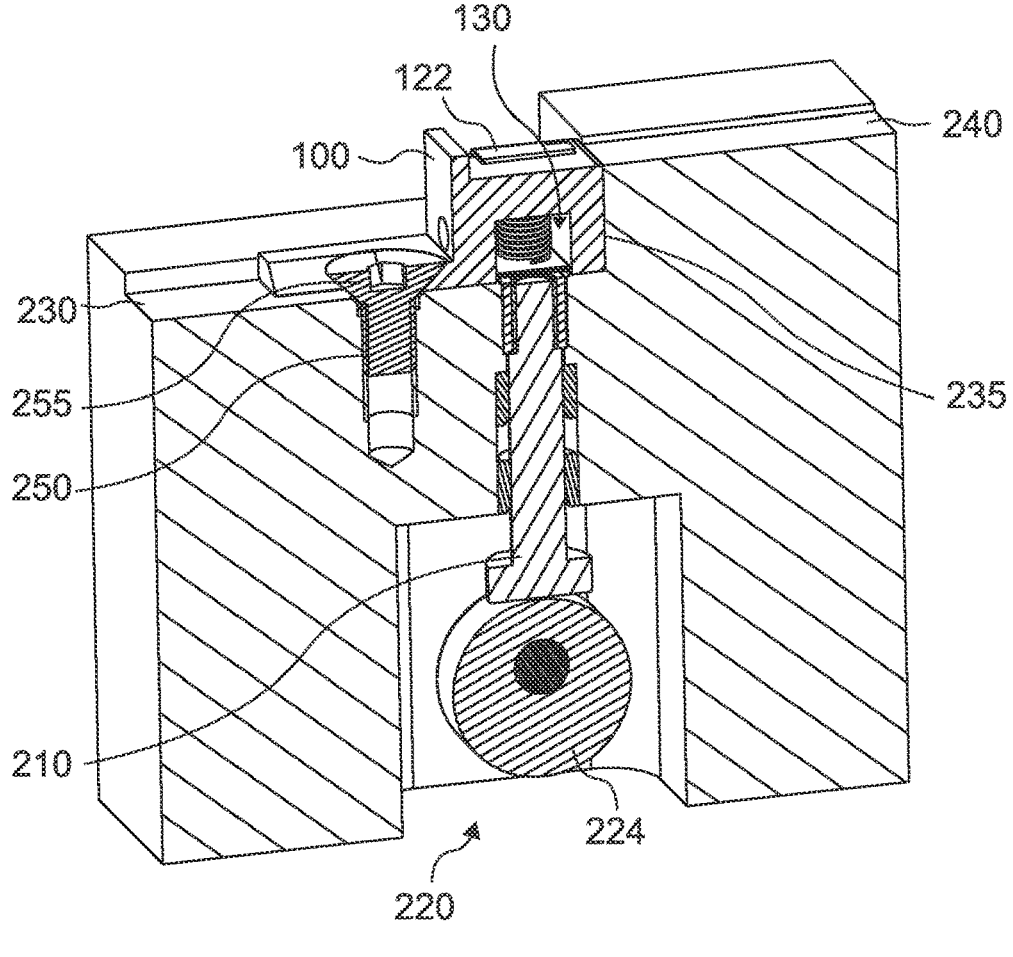
FIG. 2d shows a sectional view of a mechanism for moving a mechanical component of a loading device according to an embodiment.

FIG. 2d shows a sectional view of an example of the mechanism for moving the mechanical component 210 of the loading device. At this point, the mechanical component (e.g., piston 210), and also the eccentric element 224, is in the "down" (i.e., retreated) position, where the retaining mechanism is not actuated. A guidance marker may be provided for the user to help the user distinguish between the positions. The mechanical component 210 for elevating the spring 124 can be actuated via the eccentric element 224, which is turned by the lever 222.

Figures 2E, 2F:
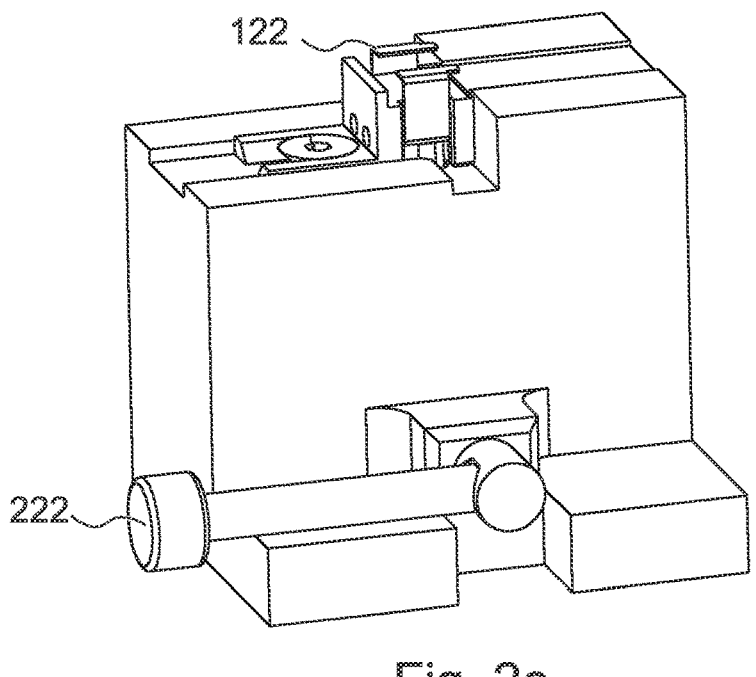
FIGS. 2e, 2f and 2g show schematic diagrams of a loading device with a sample holder, with a retaining mechanism of the sample holder being in an opened state, according to an embodiment.
Figure 2G:
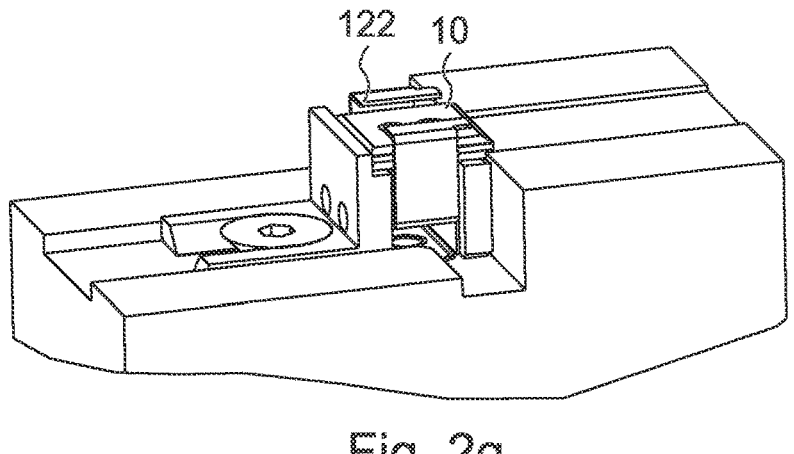

Once the sample holder is attached to the loading device, the lever can be turned to the other side (see FIG. 2e), such that the eccentric element 224 is turned, pushing the mechanical component 210 towards the bottom component of the retaining mechanism of the sample holder 100 (through interface 130), eventually compressing the spring 124 (thereby actuating the retaining mechanism and putting the retaining mechanism into the opened state) and providing an opening between the holding component 122 and the first surface area 112 (see FIG. 2f). In effect, the holding component is lifted, and access is given for loading the sample or stack of layers into the sample holder. FIGS. 2e to 2g show schematic diagrams of examples of the loading device with the sample holder, with the retaining mechanism of the sample holder being in the opened state.

After actuating, and thus opening, the retaining mechanism, the second recess 240 may be used to guide insertion of the sample into the sample holder. In particular, the second recess 240 may be used for guiding insertion of the sample, such as the stack of layers comprising the sample, into the sample holder. Mechanically, this may be achieved by arranging the two recesses at different heights. For example, as shown in FIGS. 2a to 2i, the loading device may comprise a first portion having a first lower vertical height and a second portion having a second higher vertical height. The first portion may comprise the first recess 230 and the second portion may comprise the second recess 240. In effect, the first recess 230 is at a lower height compared to the second recess 240. It can be used to guide (a sliding movement of) the sample holder 100 towards the second portion with the second recess 240, until it is in contact with the stopping surface area 235, which is arranged at a surface area of the second portion facing towards the first portion. Once the sample holder is pressed against the stopping surface area 235, it may be both aligned with the mechanical component 210 and with the second recess 240. For example, the second recess may be at a vertical height that is aligned with the first surface area 112 of the main component of the sample holder when the sample holder 100 is inserted into the first recess 230. As shown in FIG. 2g, in this position, the sample, or stack of layers 10, may be slid into the sample holder 100, guided by the second recess 240.

Figure 2H:
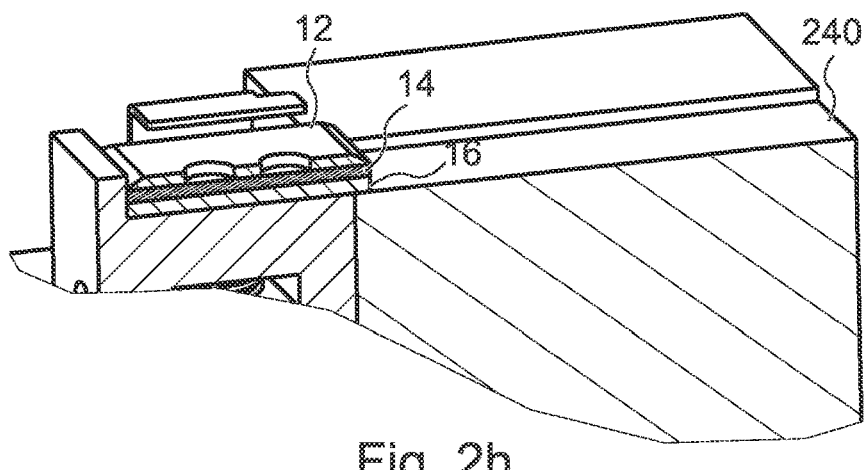
FIG. 2h shows a schematic diagram illustrating insertion of a stack of layers into a sample stage via a recess of a loading device according to an embodiment.

FIG. 2h shows a schematic diagram of an insertion of the stack of layers 12; 14 16 into the sample stage via the second recess 240 of a loading device. As is visible in FIG. 2h, the stack of layers may comprise a support layer 16, the sample 14, and a foil mask support layer 12. As shown in FIG. 2h, the foil mask support layer 12 may comprise two openings, which may be suitable for picking up the foil mask support layer 12 with tweezers.

Figure 2I:
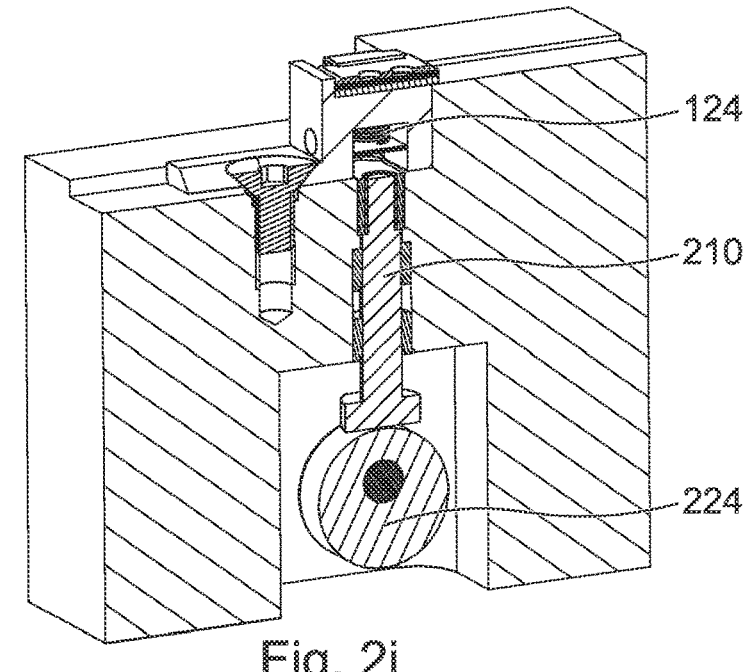
FIG. 2i shows a sectional view of a mechanism for moving a mechanical component of a loading device after insertion of a sample into a sample holder that is attached to the loading device, according to an embodiment.

After the sample or stack of layers has been inserted, the lever can be moved back to the initial position, which may put the mechanical component 210 and eccentric element 224 into the "down" position again, so that the sample holder reverts to the closed position. FIG. 2i shows a sectional view of an example of the mechanism for moving the mechanical component of the loading device after insertion of the sample into the sample holder that is attached to the loading device. As can be seen in FIG. 2i, due to the height of the stack of layers, the spring 124 remains compressed, thus exerting force onto the stack of layers, so that the stack of layers is retained, and thus held right, by the sample holder. In effect, the spring of the retaining mechanism fixes the sample within the holder. Now, the sample is clamped within the sample holder. Subsequently, the sample holder may be loosened (e.g., by loosening the screw or bolt), and protrusion of excess sample may be cut off (if necessary). Then, the sample holder is ready for transfer to the sample stage (e.g., for alignment with the mask being used in the ion milling process).

More details and aspects of the loading device, sample holder and sample or stack of layers are mentioned in connection with the proposed concept, or one or more examples described above or below (e.g., FIG. 1a to 1d, 3 to 4e). The loading device, sample holder and sample or stack of layers may comprise one or more additional optional features corresponding to one or more aspects of the proposed concept, or one or more examples described above or below.

Figure 3:
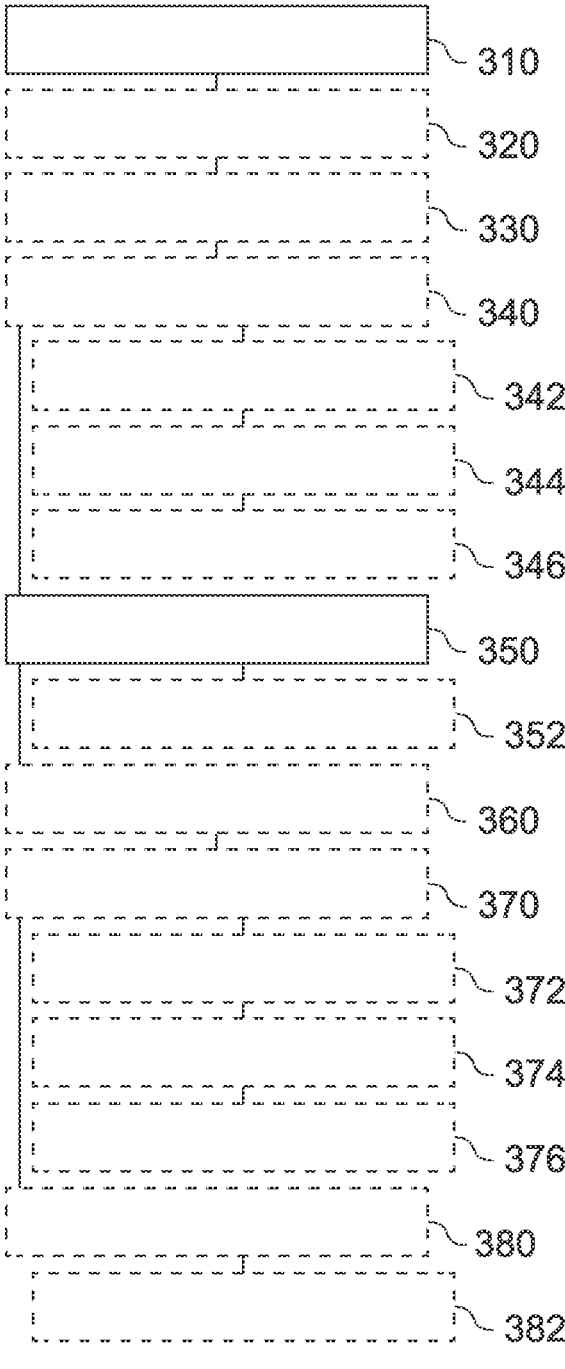
FIG. 3 shows a flow chart of a method for inserting a sample into a sample holder according to an embodiment.

FIG. 3 shows a flow chart of an example of a method for inserting a sample, e.g., the sample introduced in connection with FIGS. 1a to 2i, into a sample holder, e.g., into the sample holder introduced in connection with FIGS. 1a to 1d, with the sample holder being suitable for holding, and in particular retaining, the sample during an ion milling process. As will become evident, many features of the method have been discussed in connection with FIGS. 1a to 2i. Where this is not the case, a more detailed discussion of the feature will be given in the following.

The method starts with placing 310 the sample 14 between the first 12 and the second 16 support layer to form the stack of layers 10 comprising the sample 14 (e.g., as shown in FIG. 1c). As outlined in connection with the previous Figures, the sample 14 may be placed between support layers with a modicum of alignment and pre-cutting of the sample 14. Due to the nature of the insertion process, the final alignment of the layers may be done by the sample holder, as the layers are pressed against the second surface area and constrained by the side component(s) of the clamp of the retaining mechanism.

After the sample is placed between the support layers, thereby forming the stack of layers, the stack of layers is inserted 340 into the sample holder. As has become evident in connection with FIGS. 1a to 2i, this insertion process may be supported by a retaining mechanism of the sample holder, and further optionally by a loading device.

In the following, it is assumed that the loading device is used to assist the user in inserting the stack of layers into the sample holder. However, the use of the loading device is optional. For example, the retaining mechanism may be operated manually by the user, to allow insertion of the stack of layers into the sample holder.

If the loading device is used to assist the user, the method may comprise attaching 320 the sample holder to the loading device. For example, attaching 320 the sample holder may comprise inserting the sample holder into the first recess of the loading device, sliding the sample holder along the first recess until it is in contact with the stopping surface area of the loading device, e.g., so that the interface and retaining mechanism is aligned with the mechanical component of the loading device and the fixing arrangement (e.g., recess or opening) of the sample holder is aligned with the thread of the loading device. Then, the sample holder may be fixed to the loading device, e.g., by fastening a screw or bolt to the loading device via the thread.

The method may comprise actuating 330 the retaining mechanism of the sample holder to enter the retaining mechanism into the opened state to provide the opening between the first surface area and the holding component. Subsequently, the stack of layers may be inserted into the sample holder while the retaining mechanism is in the opened state. As outlined in connection with the loading device, the retaining mechanism may be actuated 330 by moving the movable mechanical component of the loading device. The movable mechanical component, in turn may be actuated by a lever and an eccentric element. Accordingly, the act of moving 336 the mechanical component may comprise turning 332 the lever of the loading device to turn 334 the eccentric element that moves 336 the movable mechanical component of the loading device, thus actuating 330 the retaining mechanism of the sample holder.

Once the retaining mechanism is opened, the stack of layers can be slid into the opening, between the holding component and the first surface area of the main component of the sample holder. As outlined in connection with FIGS. 1a to 1d, the sample holder comprises the main component with the first surface area for receiving the longitudinal surface area of the stack of layers and the retaining mechanism, and optionally the second surface area for receiving the transverse surface area of the stack of layers. The act of inserting the stack of layers into the sample holder may comprise sliding 342 the stack of layers into the opening between the first surface area of the main component and the holding component of the retaining mechanism, e.g., until the stack of layers is pressed against the second surface area of the main component.

Once the stack of layers is inserted into the sample holder, the retaining mechanism of the sample holder may be put into the closed state (e.g., via the lever of the loading device), so that the retaining mechanism retains the stack of layers, and the sample holder may be detached from the loading device. Moreover, excess material of the sample (extending beyond the support layers) may be removed after the sample is placed between the support layers (and is held tight by the retaining mechanism). Accordingly, the method may comprise cutting 350 off excess material of the sample at the edge of the first and second support layer after placing the sample between the first and second support layer. In general, the excess material of the sample may be cut off after inserting the stack of layers into the sample holder, e.g., once the stack of layers is retained by the retaining mechanism. For example, the excess material may be cut off after (or before) the sample holder is detached from the holding device.

Subsequently, the sample holder may be inserted, with the stack of layers, into a sample stage, where it may be aligned with the mask being used in the ion milling process. Accordingly, the method may comprise inserting 360 the sample holder with the stack of layers into a sample stage (of the preparation instrument, i.e., the ion mill) and aligning 370 the stack of layers with a mask for use in the ion milling process. For example, in the instrument (being used for aligning the sample with the mask), the protrusion of the (stack of layers with the) sample above the mask edge can be adjusted in a known manner using an optical microscope and/or a camera. For example, the sample stage with the sample stage may first be swiveled/rotated (downwards) by 90° to align the sample horizontally and vertically to the mask. Accordingly, aligning the stack of layers with the mask comprises aligning 372 the stack of layers with the mask in a first and a second dimension (e.g., the horizontal and vertical dimension). Then, the sample stage with the sample holder may be rotated (back) to put the sample stage into the upright position again, in order to adjust the distance between sample and mask. In other words, the method may comprise, after aligning the stack of layers in the first and second dimension, rotating 374 the sample stage and aligning 376 the stack of layers with the mask in a third dimension. Using the adjustment mechanism of the sample stage and the optical microscope/camera of the preparation device, the sample may be positioned behind the edge of the mask so that it protrudes by 20 µm to 100 µm parallel to the mask edge. The mask edge may be in loose contact with the sample over its entire width.

Figure 4D:
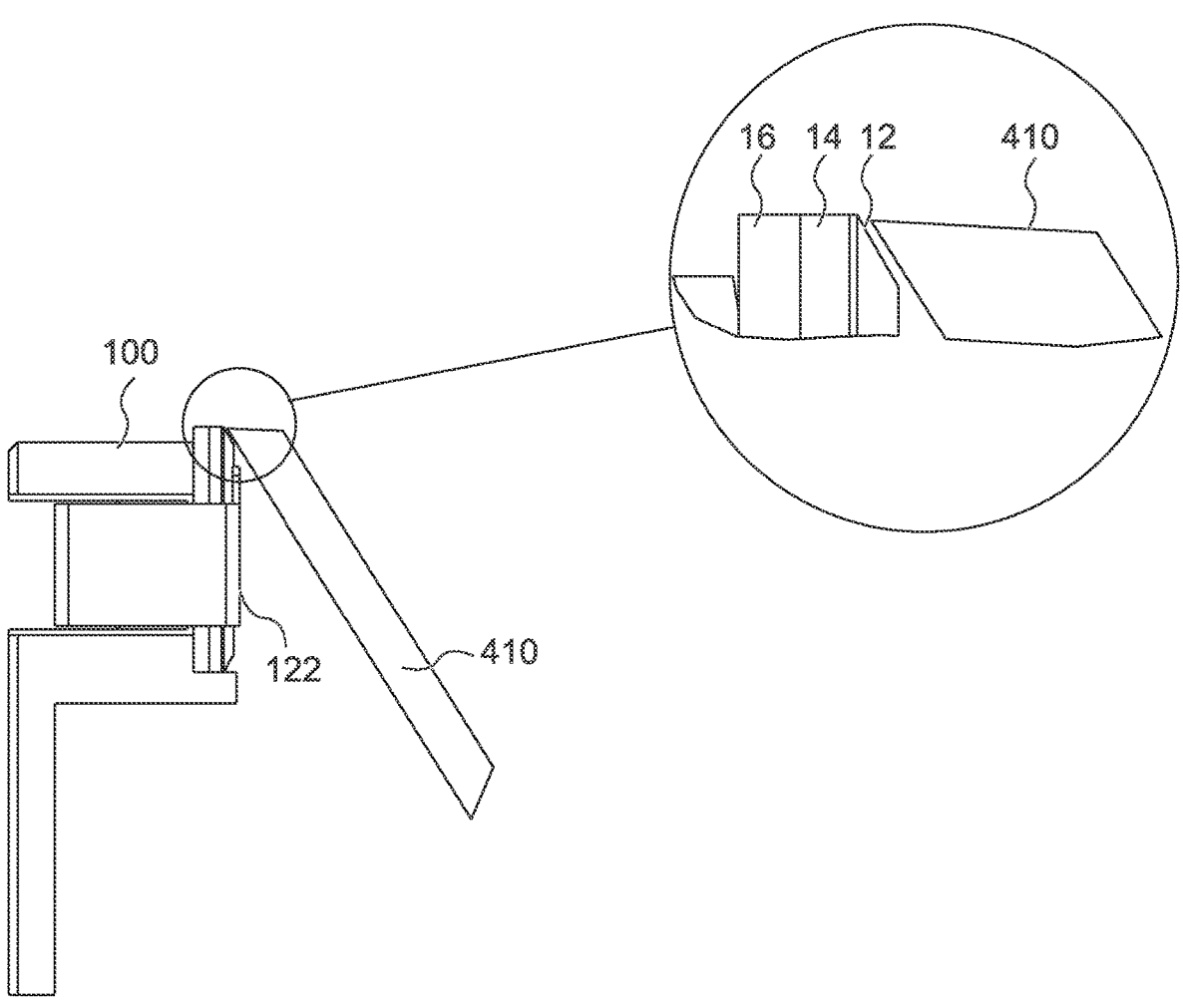
FIG. 4d shows a schematic diagram illustrating an alignment between a stack of layers comprising a sample and a mask according to an embodiment.

FIGS. 4a to 4e illustrate the alignment process. FIGS. 4a to 4c show schematic diagrams of a process for aligning a mask 410 with a sample 14 in preparation of an ion milling process. In FIG. 4a, the device being used for performing the alignment is shown with the sample stage 400, a sample holder 420 and the mask 410. As indicated by arrows 430, 435, the sample may be moved vertically (430) and laterally (435). The alignment is performed with the help of a microscope. FIG. 4b shows a magnified view of the sample 14 and the edge of the mask 410. FIG. 4c shows the spatial arrangement of the sample holder 420, the sample 14 and the mask 410. FIG. 4c further shows a set screw 440 for setting the distance between the edge of the mask 410 and the sample 14.

FIG. 4d shows a schematic diagram of an example of the alignment between the stack of layers 12; 14; 16 comprising the sample 14 and the mask 410. As shown in FIG. 4d, one of the first and second support layer (the first support layer 12 in this case) comprises slanted edges for aligning the stack of layers with the mask 410 during the ion milling process. The slanted/chamfered edges also facilitate the alignment process.

Figure 4E:
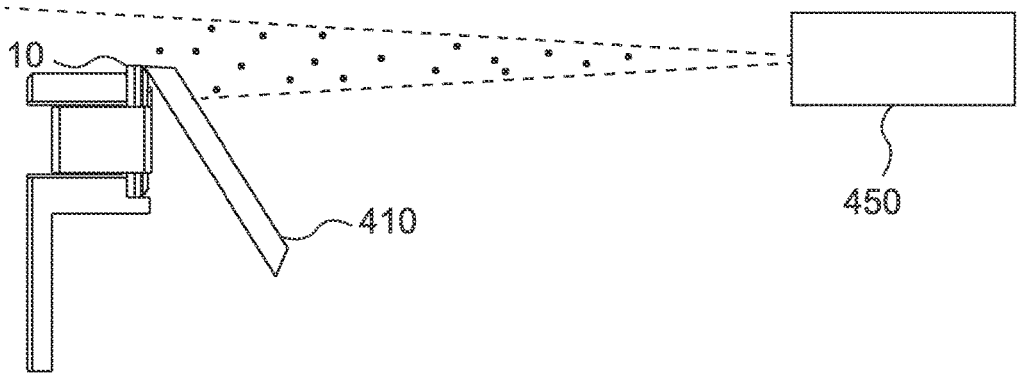
FIG. 4e shows a schematic diagram illustrating an ion milling process according to an embodiment.

Now the preparation (i.e., ion milling) process can be started. FIG. 4e shows a schematic diagram of an example of the ion milling process. The method (of FIG. 3) may further comprise ion milling 380 the sample. The mask 410 shades part of the (argon) ion beam being emitted by the ion gun 450. The remaining part of the beam hits the sample sandwich 10 comprising or consisting of the front support plate 12, the sample 14 and the rear support plate 16 and removes material down to the height of the mask edge through the sputtering process. Clamping the sample between the two support layers prevents bending of even thin, soft, or brittle samples.

In general, bombardment with the ion beam can cause significant heat generation at the points where it impinges. The design of the sample holder may take into account that heat-sensitive samples may be cooled during the preparation process to avoid damaging them. Therefore, both support plates of the foil sample holder may have good thermal contact with the sample holder, which in turn can be actively cooled via the stage and may thus be effectively cooled. In addition, the mask adjacent to the sample can be cooled so that, if necessary, all thermal energy introduced by the beam is effectively dissipated. In effect, cooling may be applied 382 to the sample during the ion milling process via the first and second support layer and a surface area (e.g., the first surface area and the second surface area) of the sample holder (and the entire sample holder, including the clamp with the holding component, side component(s), bottom component, and the spring. To support the cooling, the sample holder may comprise, or be made of, metal, as has been discussed in connection with FIGS. 1a to 1d.

More details and aspects of the method are mentioned in connection with the proposed concept, or one or more examples described above or below (e.g., FIG. 1a to 2i). The method may comprise one or more additional optional features corresponding to one or more aspects of the proposed concept, or one or more examples described above or below.

As used herein the term "and/or" includes any and all combinations of one or more of the associated listed items and may be abbreviated as "/".

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

10 Stack of layers
10a Longitudinal surface area
10b Transversal surface area
12 First support layer
14 Sample
16 Second support layer
100 Sample holder
110 Main component
112 First surface area
114 Second surface area
120 Retaining mechanism
122 Holding component
124 Spring
126 Side component
128 Bottom component
130 Interface
140 Fixing arrangement, recess, opening
200 Loading device
210 Mechanical component, piston
220 Mechanism
222 Lever
224 Eccentric element
230 First recess
235 Stopping surface area
240 Second recess
250 Thread
255 Screw or bolt
310 Placing a sample between a first and a second support layer
320 Attaching a sample holder to a loading device
330 Actuating a retaining mechanism
332 Turning a lever
334 Turning an eccentric element
336 Moving a mechanical component
340 Inserting a stack of layers into the sample holder
342 Sliding the stack of layers
350 Cutting off excess material
360 Inserting the sample holder into a sample stage
370 Aligning the stack of layers with a mask
372 Aligning the stack of layers in a first and second dimensions
374 Rotating the sample stage
376 Aligning the stack of layers in a third dimension
380 Ion milling
382 Applying cooling
400 Sample stage
410 Mask
420 Sample holder
430 Lateral movement
435 Vertical movement
440 Set screw
450 Ion gun

The invention claimed is:

1. A sample holder comprising:

a main component comprising a first surface area for receiving a sample thereon; and a retaining mechanism comprising a clamp and a spring, wherein the clamp comprises a bottom component and a holding component, the sample being disposed between the holding component and the first surface area, the spring being disposed between the main component and the bottom component, wherein the retaining mechanism is configured to retain the sample in the sample holder in a closed state of the retaining mechanism such that the sample is clamped by the holding component against the first surface area via the spring, wherein the retaining mechanism is configured to enter an opened state upon mechanical actuation of the retaining mechanism, the opened state allowing insertion and removal of the sample, and wherein the retaining mechanism is configured to revert to the closed state once the mechanical actuation is removed.

2. The sample holder according to claim 1, wherein the retaining mechanism is configured to enter the opened state upon the mechanical actuation of the retaining mechanism by a mechanical component of a loading device.

3. The sample holder according to claim 1, wherein the spring is compressed when the retaining mechanism is actuated.

4. The sample holder according to claim 1, wherein the retaining mechanism is configured to retain a stack of layers comprising the sample, wherein the first surface area forms a first border area with a longitudinal surface area of the stack of layers, the main component further comprising a second surface area that forms a second border area with a transverse surface area of the stack of layers.

5. A loading device for a sample holder according to claim 1, the loading device comprising a mechanical component for actuating the retaining mechanism of the sample holder to put the retaining mechanism of the sample holder into the opened state.

6. The loading device according to claim 5, comprising a first recess for receiving the sample holder.

7. The loading device according to claim 6, comprising a stopping surface area that is arranged such that, with the sample holder being inserted into the first recess up to the stopping surface area, the sample holder is aligned with the mechanical component.

8. The loading device according to claim 6, comprising a second recess for guiding insertion of the sample into the sample holder.

9. The loading device according to claim 8, comprising a first portion having a first vertical height and a second portion having a second vertical height, wherein the first portion comprises the first recess and the second portion comprises the second recess, the second vertical height being greater than the first vertical height.

10. The loading device according to claim 9, wherein a surface area of the second portion facing towards the first portion comprises a stopping surface area for aligning the sample holder with the mechanical component.

11. The loading device according to claim 5, comprising a thread for receiving a screw or bolt for fixing the sample holder to the loading device.

12. A method for inserting a sample into a sample holder according to claim 1 and for holding the sample during an ion milling process, the method comprising:

placing the sample between a first support layer and a second support layer to form a stack of layers comprising the sample; and inserting the stack of layers into the sample holder.

13. The method according to claim 12, further comprising cutting off excess material of the sample at an edge of the first support layer and the second support layer after placing the sample between the first support layer and the second support layer.

14. The method according to claim 12, wherein one of the first support layer and the second support layer comprises slanted edges for aligning the stack of layers with a mask during the ion milling process.

15. The method according to claim 12, further comprising ion milling the sample, wherein cooling is applied to the sample during the ion milling via the first support layer, the second support layer, and a surface area of the sample holder.

* * * * *